(12) United States Patent
Shen et al.

(10) Patent No.: US 11,195,722 B2
(45) Date of Patent: Dec. 7, 2021

(54) METHOD OF MANUFACTURE USING COMPLEMENTARY CONDUCTIVITY-SELECTIVE WET-ETCHING TECHNIQUES FOR III-NITRIDE MATERIALS AND DEVICES

(71) Applicant: Georgia Tech Research Corporation, Atlanta, GA (US)

(72) Inventors: Shyh-Chiang Shen, Atlanta, GA (US); Theeradetch DetchProhm, Atlanta, GA (US); Russell Dean Dupuis, Atlanta, GA (US); Young Jae Park, Atlanta, GA (US); Oliver Moreno, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 57 days.

(21) Appl. No.: 16/496,782

(22) PCT Filed: Mar. 23, 2018

(86) PCT No.: PCT/US2018/024169
§ 371 (c)(1),
(2) Date: Sep. 23, 2019

(87) PCT Pub. No.: WO2018/175981
PCT Pub. Date: Sep. 27, 2018

(65) Prior Publication Data
US 2020/0381260 A1    Dec. 3, 2020

Related U.S. Application Data

(60) Provisional application No. 62/475,576, filed on Mar. 23, 2017.

(51) Int. Cl.
*H01L 21/306* (2006.01)
*H01L 21/3063* (2006.01)

(52) U.S. Cl.
CPC .. *H01L 21/30612* (2013.01); *H01L 21/30635* (2013.01)

(58) Field of Classification Search
None
See application file for complete search history.

(56) References Cited

U.S. PATENT DOCUMENTS 6,143,155 A    11/2000  Adams et al.
6,556,610 B1   4/2003   Jiang et al.
(Continued)

OTHER PUBLICATIONS

Search Report and Written Opinion from PCT application No. PCT/US19/024169 dated Jul. 23, 2018.

*Primary Examiner* — Alexander G Ghyka
(74) *Attorney, Agent, or Firm* — Troutman Pepper Hamilton Sanders LLP; Ryan A. Schneider

(57) ABSTRACT

Methods for wet-etching semiconductor samples and devices fabricated from the same are disclosed. The methods can be for selectively wet-etching a semiconductor sample comprising selecting a liquid-phase solution such that when the semiconductor sample is etched with the liquid-phase solution, at least a portion of one of a first doped region or a second doped region is etched at a greater rate than at least a portion of the other of the first doped region or the second doped region; and wet-etching, with the liquid-phase solution, the at least a portion of one of the first doped region or the second doped region at a first etch rate and the at least a portion of the other of the first doped region or the second doped region at a second etch rate; wherein the first etch rate can be greater than the second etch rate.

23 Claims, 4 Drawing Sheets

(56) References Cited

U.S. PATENT DOCUMENTS

2003/0012925 A1    1/2003   Gorrell
2003/0021571 A1    1/2003   Lian et al.
2010/0072518 A1    3/2010   Shen et al.
2011/0309411 A1   12/2011   Takemura
2016/0247712 A1*   8/2016   Matsushita ......... H01L 29/0649

* cited by examiner

METHOD OF MANUFACTURE USING COMPLEMENTARY CONDUCTIVITY-SELECTIVE WET-ETCHING TECHNIQUES FOR III-NITRIDE MATERIALS AND DEVICES

CROSS-REFERENCE TO RELATED APPLICATIONS

This application is a national stage application under 35 USC § 371 of International Application No. PCT/US2018/024169 filed 23 Mar. 2018, which International Application claims priority under 35 USC § 119(e) to U.S. Provisional Patent Application No. 62/475,576 filed 23 Mar. 2017, each of which entitled "A Method of Manufacture Using Complementary Conductivity-Selective Wet-Etching Techniques for III-Nitride Materials and Devices," the entire contents and substance of each are hereby incorporated by reference as if fully set forth below.

TECHNICAL FIELD

The present invention relates to the manufacture of etched structures on semiconductor samples and, in particular, to a method of manufacture of wide bandgap semiconductor devices resulting in wide bandgap semiconductor devices having high quality etched features.

BACKGROUND

Wet-chemical etching in gallium nitride (GaN) has been used for defect revealing in early days of GaN studies. The use of wet chemical etching in GaN device processing was deemed not feasible to achieve smooth etched surface morphology due to the high level of defect densities for GaN and related group-III nitride films grown on foreign substrates. Etching in group-III nitride layers has commonly been done using inductively coupled plasma (ICP) reactive-ion etching (RIE) in device processing recipes. A major downside to known techniques is the inevitable surface and sub-surface damage.

SUMMARY

Methods for wet-etching semiconductor samples and devices fabricated from the same are described. In some embodiments, the method can be for selectively wet-etching a semiconductor sample, the semiconductor sample can comprise a first doped region and a second doped region, wherein a free electron concentration of the first doped region can be less than a free electron concentration of the second doped region, the method can comprise: selecting a liquid-phase solution such that when the semiconductor sample is etched with the liquid-phase solution, at least a portion of one of the first doped region or the second doped region can be etched at a greater rate than at least a portion of the other of the first doped region or the second doped region; and wet-etching, with the liquid-phase solution, the at least a portion of one of the first doped region or the second doped region at a first etch rate and the at least a portion of the other of the first doped region or the second doped region at a second etch rate; wherein the first etch rate can be from about 10 times to about 300 times greater than the second etch rate.

In some embodiments, the first and the second doped regions can each be n-type doped regions.

In some embodiments, the first doped region can have a free electron concentration of from about $1 \times 10^{-15}$ cm$^{-3}$ to about $5 \times 10^{16}$ cm$^{-3}$.

In some embodiments, the second doped region can have a free electron concentration of from about $1 \times 10^{18}$ cm$^{-3}$ to about $10^{21}$ cm$^{-3}$.

In some embodiments, at least a portion of one of the first doped region or the second doped region can be etched at a rate of about 0.1 nm per minute to 1000 nm per minute.

In some embodiments, the first etch rate can be from about 100 times to about 300 times greater than the second etch rate.

In some embodiments, the etching can be performed at a temperature of from about 20° C. to about 100° C.

In some embodiments, the first doped region and the second doped region can each comprise a wide bandgap semiconductor material.

In some embodiments, the wide bandgap semiconductor material can comprise a Group-III-nitride or zinc oxide.

In some embodiments, the wide bandgap material can be selected from the group consisting of a binary compound, ternary compound, and quaternary compound.

In some embodiments, the first doped region can be a first layer of the semiconductor sample.

In some embodiments, the second doped region can be a second layer of the semiconductor sample.

In some embodiments, each of the first and second layer of the semiconductor sample can have a thickness between about 50 nm and about 5000 nm.

In some embodiments, at least a portion of the first doped region can be selectively wet-etched at a greater rate than at least a portion of the second doped region to form an etched region and an unetched region.

In some embodiments, the unetched region can be the second doped region.

In some embodiments, the method can comprise: applying a UV light source to the semiconductor sample; and removing the semiconductor sample from the liquid-phase solution.

In some embodiments, the emission wavelength range of the UV light source can be from about 900 nm to about 190 nm.

In some embodiments, the liquid-phase solution can comprise a hydroxide and a persulfate.

In some embodiments, the hydroxide can be potassium hydroxide (KOH).

In some embodiments, the persulfate can be potassium persulfate ($K_2S_2O_8$).

In some embodiments, the liquid-phase solution can be an aqueous solution comprising: potassium hydroxide (KOH) which can be at a concentration of from about 0.001 to about 10 mole/L; and potassium persulfate ($K_2S_2O_8$), which can be at a concentration of from about 0.001 to about 10 mole/L.

In some embodiments, at least a portion of the second doped region can be selectively wet-etched at a greater rate than at least a portion of the first doped region to form an etched region and an unetched region.

In some embodiments, the unetched region can be the first doped region.

In some embodiments, the method can comprise: providing an electrical source, an anode, and a cathode; wherein a first end of the anode can be attached to a noble metal and a second end of the anode can be attached to a source; and wherein a first end of the cathode can be attached to the semiconductor sample and a second end of the cathode can be attached to the source; and wherein the electrical source can be selected from a voltage source or a current source, the electrical source can provide electrical energy in the form of direct current, alternating current, or pulsed width current, in which the width of the pulse can be as short as 10 ns.

In some embodiments, the noble metal can be selected from platinum or gold.

In some embodiments, the liquid phase solution can consist of an acid.

In some embodiments, the liquid phase solution can be selected from the group consisting of phosphoric acid, nitric acid, and hydrochloric acid.

In some embodiments, the described methods can be a method of fabricating an optoelectronic device, the method can comprise: providing a semiconductor sample, the semiconductor sample can comprise a first doped region and a second doped region, wherein a free electron concentration of the first doped region be less than a free electron concentration of the second doped region; selecting a liquid-phase solution such that when the semiconductor sample is etched with the liquid-phase solution, at least a portion of one of the first doped region or the of second doped region can be etched at a greater rate than at least a portion of the other of the first doped region or the second doped region; and wet-etching, with the liquid-phase solution, at least a portion of one of the first doped region or the second doped region at first etch rate and at least a portion of the other of the first doped region or the second doped region at a second etch rate to form an etched region and an unetched region; wherein the first etch rate can be greater than the second etch rate.

In some embodiments, the first doped region and the second doped region can be in the form of layers.

In some embodiments, wherein the etched region can be removed from the semiconductor sample during the wet-etching step.

In some embodiments, the method can further comprise forming an air gap region, the air gap region can be disposed on at least a portion of the unetched region.

In some embodiments, the optoelectronic device can be a distributed Bragg reflector (DBR).

In some embodiments, the first and the second doped regions can each be n-type doped layers.

In some embodiments, the first doped layer can have a free electron concentration of from about $1 \times 10^{10}$ cm$^{-3}$ to about $5 \times 10^{16}$ cm$^{-3}$ and the second doped layer can have a free electron concentration of from about $1 \times 10^{18}$ cm$^{-3}$ to about $10^{21}$ cm$^{-3}$.

In some embodiments, the first etch rate can be from about 10 times to about 300 times greater than the second etch rate.

In some embodiments, the method can further comprise, during the wet-etching step, applying a UV light source to the semiconductor sample.

In some embodiments, the method can further comprise, during the wet-etching, providing an electrical source, and anode, and a cathode; wherein a first end of the anode can be attached to a noble metal and a second end of the anode can be attached to a source; and wherein a first end of the cathode can be attached to the semiconductor sample and a second end of the cathode can be attached to the source; and wherein the electrical source can be selected from a voltage source and a current source, the electrical source can provide electrical energy in the form of direct current, alternating current, or pulsed width current, in which the width of the pulse can be as short as less than 10 ns.

A distributed Bragg reflector (DBR) is described. In some embodiments, the DBR can comprise: a first semiconductor layer; a second semiconductor layer; and an air gap layer disposed between the first and second semiconductor layers; wherein the DBR can comprise no more than about 10 semiconductor layers; and wherein the DBR can have a reflectivity of from about 30% to about 99.9% at a center wavelength range of from about 100 nm to about 900 nm.

In some embodiments, at least a portion of the first and second semiconductor layers can comprise a III-nitride (III-N) semiconductor.

In some embodiments, at least a portion of the first and second semiconductor layers can comprise an n-type doped material.

In some embodiments, at least a portion of the first and second semiconductor layers can be an n-type doped material having a free electron concentration of from about $10^{10}$ cm$^{-3}$ to about $5 \times 10^{16}$ cm$^{-3}$.

In some embodiments, at least a portion of the first and second semiconductor layers can an n-type doped material having a free electron concentration of from about $1 \times 10^{18}$ cm$^{-3}$ to about $10^{21}$ cm$^{-3}$ In some embodiments, the first and second semiconductor layers each has a thickness of about 50 nm to about 500 nm.

In some embodiments, the air gap layer can have a thickness of about 40 nm to about 1000 nm.

BRIEF DESCRIPTION OF THE DRAWINGS

Reference will now be made to the accompanying drawings, which are not necessarily drawn to scale.

DETAILED DESCRIPTION

Figure 1:
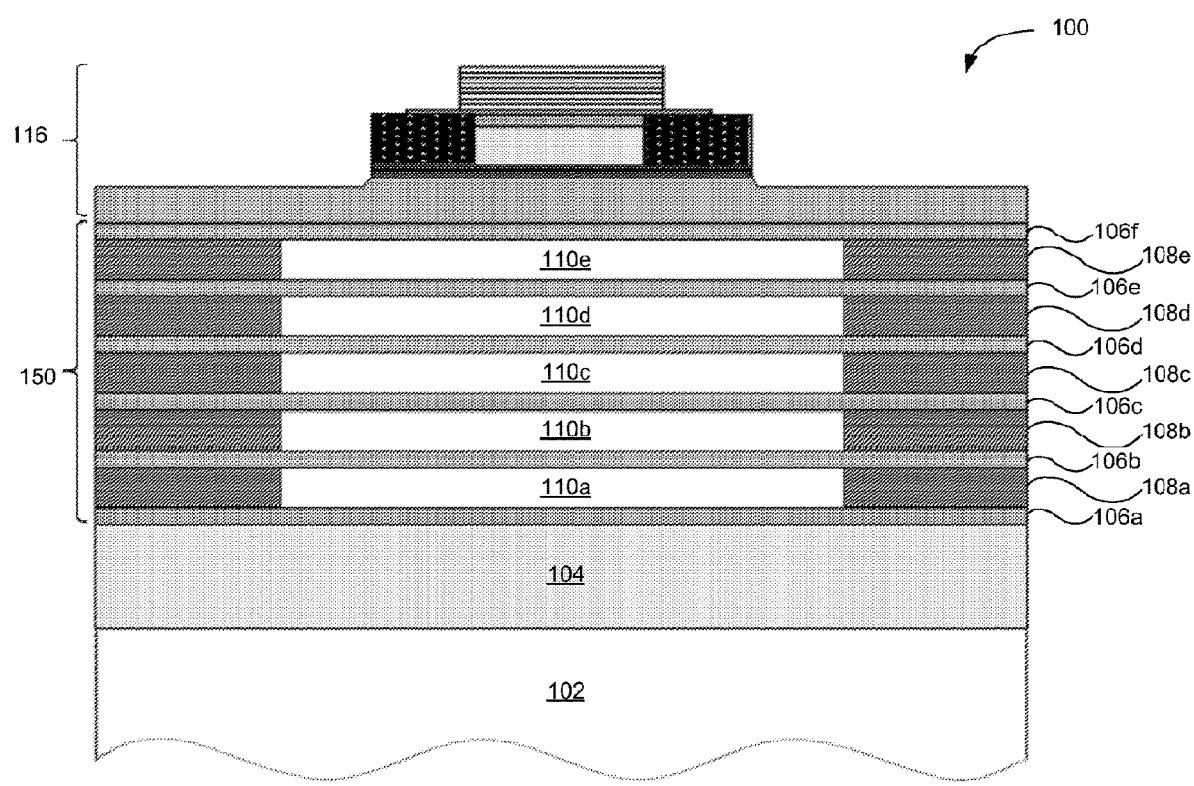
FIG. 1 is a schematic representation of an optoelectronic device according to an embodiment of the invention.

It must also be noted that, as used in the specification and the appended claims, the singular forms "a," "an" and "the" include plural references unless the context clearly dictates otherwise. For example, reference to a component is intended also to include composition of a plurality of components. References to a composition containing "a" constituent is intended to include other constituents in addition to the one named.

Also, in describing the certain example embodiments, terminology will be resorted to for the sake of clarity. It is intended that each term contemplates its broadest meaning as understood by those skilled in the art and includes all technical equivalents which operate in a similar manner to accomplish a similar purpose.

Ranges can be expressed herein as from "about" or "approximately" or "substantially" one particular value and/or to "about" or "approximately" or "substantially" another particular value. When such a range is expressed, other example embodiments include from the one particular value and/or to the other particular value.

Similarly, as used herein, "substantially free" of something, or "substantially pure", and like characterizations, can include both being "at least substantially free" of something, or "at least substantially pure", and being "completely free" of something, or "completely pure".

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

The materials described as making up the various elements of certain embodiments are intended to be illustrative and not restrictive. Many suitable materials that would perform the same or a similar function as the materials described herein are intended to be embraced within the scope of the invention. Such other materials not described herein can include, but are not limited to, for example, materials that are developed after the time of the development of the invention.

Embodiments of the present disclosure relate to methods of wet-etching group-III nitride materials and the manufacture of semiconductor devices using the disclosed methods. In some embodiments, the present disclosure includes conductivity-selective wet-etching techniques enable manufacturing of high quality etched features in semiconductor devices. In some embodiments, the present disclosure includes methods of wet-etching semiconductor samples that can be used in the fabrication of semiconductor devices and semiconductor devices fabricated by utilizing said methods.

In some embodiments, the method can be a method for selectively wet-etching a semiconductor sample. The semiconductor sample can comprise a first doped region and a second doped region. The free electron concentration of the first doped region can be less than the free electron concentration of the second doped region. In other words, the semiconductor sample can comprise a lightly doped region and a heavily doped region, wherein the lightly doped region (e.g., the first doped region as defined herein) can have a free electron concentration that is less than the heavily region (e.g., the second doped region as defined herein). In some embodiments, the semiconductor sample can comprise a plurality of doped regions with varying free electron concentrations. For instance, in some embodiments, the semiconductor sample can further comprise a third doped region, wherein the third doped region can have a free electron concentration that is higher than the second doped region.

In some embodiments, the method can further comprise selecting a liquid-phase solution such that when the semiconductor sample is etched with the liquid-phase solution, at least a portion of one of the first doped region or the second doped region can be etched at a greater rate than at least a portion of the other of the first doped region or the second doped region.

In some embodiments, the method can comprise selecting two or more liquid-phase solutions such that different regions of the semiconductor sample can be etched at different relative rates, based on relative conductivity (i.e., based on relative free electron concentration). For instance, a first solution can be selected to etch the first doped region and a second solution can be selected to etch the second doped region. In some embodiments, semiconductor samples can be fabricated by utilizing the first solution, second solution, or both to etch, at a greater etch rate, a first doped region and/or a second doped region, or a plurality of doped regions.

In some embodiments, the method can further comprise wet-etching, with the liquid-phase solution, at least a portion of one of the first doped region or the second doped region at a first etch rate and at least a portion of the other of the first doped region or the second doped region at a second etch rate In some embodiments, the first and second doped regions can be n-type doped regions. In some embodiments, the semiconductor sample can comprise a first doped n-type region and a second doped n-type region. In some embodiments, the first and second doped regions can be doped p-type regions. In some embodiments, the semiconductor sample can comprise a first doped p-type region and a second doped p-type region. In some embodiments, the semiconductor sample can comprise mixed doped regions. In some embodiments, the semiconductor sample can comprise a first doped n-type region and a second doped p-type region. In some embodiments, the semiconductor sample can comprise a first doped p-type region and a second doped n-type region. In some embodiments, the semiconductor sample can comprise a plurality of regions, wherein each of the plurality of regions can be doped n-type or doped p-type regions.

The first and second doped regions can be doped with various materials. A doped region of a semiconductor sample includes dopants that either act as donors, donating free electrons, or acceptors, where the absence of a valence electron acts like a hole that can move as a free charge carrier. A doped region of a semiconductor sample will therefore have a carrier concentration (i.e. free electron concentration or hole concentration) that is greater than the intrinsic carrier concentration of an undoped semiconductor. As a person of ordinary skill in the art would recognize, semiconductor samples or regions of semiconductor samples consisting of, or comprising, elements from column IV of the periodic table (group-IV semiconductors) can be doped with elements from column III (e.g. boron, aluminum, gallium, and the like) to form p-type material. As a person of ordinary skill in the art would recognize, semiconductor samples or regions of semiconductor samples consisting of, or comprising, elements from column IV of the periodic table (group IV semiconductors) can be doped with elements from column V (e.g. phosphorus, arsenic, or antimony) to form n-type material. As a person of ordinary skill in the art would recognize, semiconductor samples or regions of semiconductor samples consisting of, or comprising, elements from column III of the periodic table and elements from column V of the periodic table (III-V semiconductors) can be doped with elements from column II or group 12 (e.g. beryllium, magnesium, zinc, or cadmium) to form p-type material, can be doped with elements from column VI (e.g. selenium or tellurium) to form n-type material, or can be doped with elements from column IV (e.g. silicon or germanium) to form either n-type or p-type material, depending on whether the column IV element occupies a lattice site of an atom from column III or column V respectively. Depending on the elemental makeup of the semiconductor sample, potential doping elements can be selected more often than other potential dopants due to design concerns such as ease of manufacturing or temperature dependence of electrical properties. For example, silicon may be desirable as an n-type dopant and magnesium may be desirable as a p-type dopant for gallium nitride (GaN) semiconductor samples. The selection of the dopants and the doping concentration determine electrical properties of the doped region such as carrier concentration (i.e. free electron concentration or hole concentration) and conductivity.

In some embodiments, the first doped region can have a free electron concentration of less than or about $5 \times 10^{16}$ cm$^{-3}$. In some embodiments, the first doped region can have a free electron concentration of from about $1 \times 10^{-15}$ cm$^{-3}$ to about $5 \times 10^{16}$ cm$^{-3}$.

In some embodiments, second doped region can have a free electron concentration of greater than or about $1 \times 10^{18}$ cm$^{-3}$. In some embodiments, second doped region can have a free electron concentration of from about $1 \times 10^{18}$ cm$^{-3}$ to about $1 \times 10^{21}$ cm$^{-3}$.

In some embodiments, where the doped regions are p-type, the p-type region can have a free hole concentration at any value, e.g., from about $1 \times 10^{10}$ to $1 \times 10^{20}$ cm$^{-3}$. In some embodiments, an intrinsic material is used. An intrinsic material has free electron concentrations below $1 \times 10^{10}$ to $1 \times 10^{-10}$ cm$^{-3}$.

The relative doping concentrations can determine the conductivity properties of the first and second doped regions. In some embodiments, the first doped region can be etched at a first etch rate and the second doped region can be etched at a second etched rate. In other words, the first doped region can be etched at a greater rate than the second doped region. In some embodiments, the second doped region can remain substantially unetched. In some embodiments, the first doped region can be etched at the second etch rate and the second doped region can be etched at the first etch rate. In other words, the second doped region can be etched at a greater rate than the first doped region. In some embodiments, the first doped region can remain substantially unetched.

In some embodiments, at least a portion of one of the first doped region or the second doped region can be etched at first etch rate and at least a portion of the other of the first doped region or the second doped region can be etched at a second etch rate to form an etched region and an unetched region. In other words, wet-etching at the first etch rate can remove a portion of the region being etched at the first (e.g., greater) etch rate, while leaving the other region substantially intact. For example, in an embodiment where the first doped region is etched at the first (greater) etch rate, the process can form an unetched region wherein the unetched region is the second doped region. In an embodiment where the second doped region is etched at the first (greater) etch rate, the process can form an unetched region wherein the unetched region is the first doped region. The unetched region can be substantially unetched, for example, up to about 5% of the region can be etched. In an embodiment, up to about 4%, about 3%, about 2%, or about 1% of the unetched region can be etched. In an embodiment, less than about 5%, about 4%, about 3%, about 2%, or about 1% of the unetched region is etched.

In some embodiments, the disclosed methods can be conductivity-selective, wherein the first and second doped regions can be etched at different rates. In some embodiments, at least a portion of one of the first doped region or the second doped region can be etched at a first etch rate and at least a portion of the other of the first doped region or the second doped region can be etched at a second etch rate. In some embodiments, the first etch rate is from about 10 times to about 300 times greater than the second etch rate. In some embodiments, the first etch rate is from about 2 times to about 500 times, from about 5 times to about 500 times, from about 10 times to about 500 times, from about 15 times to about 500 times, from about 20 times to about 500 times, from about 30 times to about 500 times, from about 40 times to about 500 times, from about 50 times to about 500 times, from about 60 times to about 500 times, from about 70 times to about 500 times, from about 80 times to about 500 times, from about 90 times to about 500 times, from about 100 times to about 500 times, from about 200 times to about 500 times, from about 300 times to about 500 times, or from about 400 times to about 500 times, greater than the second etch rate. In some embodiments, the first etch rate is about 10 times, about 20 times, about 30 times, about 40 times, about 50 times, about 60 times, about 70 times, about 80 times, about 90 times, about 100 times, about 200 times, about 300 times, about 400 times, or about 500 times greater than the second etch rate. In some embodiments, the first etch rate is at least about 10 times, about 20 times, about 30 times, about 40 times, about 50 times, about 60 times, about 70 times, about 80 times, about 90 times, about 100 times, about 200 times, about 300 times, about 400 times, and about 500 times greater than the second etch rate.

In some embodiments, the first etch rate is from about 0.1 nm/min to about 1000 nm/min. In some embodiments, the first etch rate is from about 0.5 nm/min to about 1000 nm/min, about 1 nm/min to about 1000 nm/min, about 2 nm/min to about 1000 nm/min, about 5 nm/min to about 1000 nm/min, about 10 nm/min to about 1000 nm/min, about 20 nm/min to about 1000 nm/min, about 50 nm/min to about 1000 nm/min, about 100 nm/min to about 1000 nm/min, about 200 nm/min to about 1000 nm/min, or about 500 nm/min to about 1000 nm/min. In some embodiments, the first etch rate is from about 0.1 nm/min to about 500 nm/min, about 1 nm/min to about 500 nm/min, about 10 nm/min to about 500 nm/min, about 50 nm/min to about 500 nm/min, and about 100 nm/min to about 500 nm/min.

In some embodiments, during a wet-etching step, the material to be etched (e.g., the semiconductor sample), can be placed in an ambient environment having a temperature of from about 0° C. to about 100° C., from about 10° C. to about 100° C., from about 20° C. to about 100° C., and from about 50° C. to about 100° C.

In some embodiments, the presently disclosed methods can be utilized to fabricate wide bandgap semiconductor devices. In some embodiments, the presently disclosed methods can be used to etch wide bandgap semiconductor materials, including, but not limited to, GaN, SiC, ZnO, AlInGaN, AlGaN, and the like, and compounds thereof, including binary, ternary, and quaternary compounds. In some embodiments, the materials to be etched include group-III-nitride (III-N) binary compounds such as GaN, InN, AlN, group-III-N ternary compounds such as In$_x$Ga$_{1-x}$N, AlGa$_{1-x}$N, In$_x$Al$_{1-x}$N, where $0 \leq x \leq 1$ and group-III-N quaternary compounds such as Al$_y$In$_z$Ga$_{1-y-z}$N, where y+z=1, $0 \leq y$, and $z \leq 1$.

In some embodiments, the first doped region of the semiconductor sample can be a first layer of the semiconductor sample. In some embodiments, the second doped region of the semiconductor sample can be a second layer of the semiconductor sample. A region, as defined herein, is understood to be an area of a semiconductor sample having a particular doping concentration, doping element, or doping profile. Regions can be doped through conventional (or unconventional) means including, but not limited to, doping during material growth (e.g. chemical vapor deposition), ion implantation, diffusion, or the like. A region can be formed or shaped by any number of semiconductor techniques (e.g. photolithography, semiconductor growth, oxide growth, metal deposition, etching, etc.). A region can therefore be a layer, a well, or any other structure or area having an arbitrary shape. The region, or layer, of the semiconductor sample can have a thickness of from about 50 nm to about 5000 nm, from about 100 nm to about 4000 nm, from about 200 nm to about 3000 nm, from about 400 nm to about 2000 nm, and from about 500 nm to about 1000 nm.

In some embodiments, the first doped region can be etched at a first etch rate by using an electrode-less photo-electrochemical (ELPEC) etching technique. In an embodiment using ELPEC, the first doped region having a relatively lower free electron concentration can be etched at a greater etch rate than the second doped region have a relatively higher free electron concentration.

The ELPEC technique can include selecting a liquid-phase solution comprising a base and an oxidizing agent. In some embodiments, the liquid-phase solution can comprise a hydroxide and a persulfate. In some embodiments, the hydroxide can be an alkali metal hydroxide, for example, potassium hydroxide, sodium hydroxide, lithium hydroxide, and the like. In some embodiments, the hydroxide can be an alkaline earth metal hydroxide. In some embodiments, the hydroxide can comprise sodium hydroxide. In some embodiments, the hydroxide can comprise potassium hydroxide. In some embodiments, the hydroxide is selected from the group consisting of potassium hydroxide and sodium hydroxide. In some embodiments, the persulfate can be an alkali metal persulfate, for example, potassium hydroxide, sodium hydroxide, and the like. In some embodiments, the persulfate can comprise sodium persulfate. In some embodiments, the persulfate can comprise potassium persulfate. In some embodiments, the persulfate is selected from the group consisting of potassium persulfate and sodium persulfate. The liquid-phase solution can be an aqueous solution.

In some embodiments, the liquid-phase solution can comprise potassium persulfate ($K_2S_2O_8$) and potassium hydroxide (KOH). In some embodiments, the liquid-phase solution can comprise sodium persulfate ($Na_2S_2O_8$) and sodium hydroxide (NaOH). The concentration of hydroxide in the liquid-phase solution can be from about 0.001 to about 10 mole/L. The concentration of persulfate in the first solution can be from 0.001 to 10 mole/L.

In some embodiments using the ELPEC technique, the first doped region can be etched by placing the semiconductor sample in the liquid-phase solution and applying an ultraviolet (UV) light source to the semiconductor sample in the liquid-phase solution. The UV light source can have an emission wavelength range of from about 900 nm to about 190 nm. The UV light source may be, for example, a Xe—Hg lamp or other UV light source. The semiconductor sample can remain in the liquid phase solution with the UV light applied for between about 1 second to about 10 days.

In some embodiments, the method for selectively wet-etching a semiconductor sample using the ELPEC technique can comprise: selecting a liquid phase solution such that when the semiconductor sample is etched with the liquid-phase solution, at least a portion of a first (lightly) doped region is etched at a greater rate than a second (heavily) doped region, wherein the liquid-phase solution comprises a hydroxide and a persulfate; contacting the semiconductor sample with the liquid-phase solution; applying a UV light source to the semiconductor sample; and etching, with the liquid-phase solution, at least a portion of the first doped region to form an etched region and an unetched region. In an embodiment, the unetched region is the second (heavily) doped region.

In some embodiments, the second doped region can be etched at the first (e.g., greater) etch rate using an electrochemical (EC) etching technique. The EC technique can include selecting a liquid-phase solution that can comprise an acid. The liquid-phase solution can be an aqueous solution. In some embodiments, the liquid-phase solution can comprise hydrochloric acid (HCl), phosphoric acid ($H_3PO_4$), or nitric acid. In some embodiments, the acid is concentrated. In some embodiments, the acid is diluted. The EC technique can include the use of two electrodes: an anode electrode having a first end at least partially submerged in the liquid-phase solution, and a cathode electrode having a first end attached to an unsubmerged portion of the semiconductor sample. The submerged portion of the anode can include a noble metal such as platinum or gold. In an embodiment, the anode electrode and the cathode electrode can each have second ends, and the second ends can be attached to an electrical source such as a voltage source or a current source. In an embodiment, during the wet-etching step, electrical energy in the form of a voltage or a current may be applied to the etching system including the semiconductor sample and the liquid-phase solution via the first ends of the anode electrode and the cathode electrode. The electrical energy may be in the form of a voltage or a current that is pulsed (in which the width of the pulse can be as short as 10 ns), direct current (DC), or alternating current (AC). The semiconductor solution can be etched from about 1 second to about 24 hours.

In some embodiments, the method for selectively wet-etching a semiconductor sample using the EC technique can comprise: selecting a liquid-phase solution such that when the semiconductor sample is etched with the liquid-phase solution, at least a portion of the second (heavily) doped region is etched at a greater rate than the first (lightly) doped region, wherein the liquid-phase solution comprises an acid; contacting the semiconductor sample with the liquid-phase solution; applying a current or voltage source to the system; and etching, with the liquid-phase solution, at least a portion of the second (heavily) doped region to form an etched region and an unetched region. In an embodiment, the unetched region is the first (lightly) doped region.

In some embodiments, the presently disclosed methods can be utilized in fabricating semiconductor devices having high quality etched features. Examples of semiconductor devices that may utilize wet etching techniques include but are not limited to a distributed Bragg reflector (DBR), microelectromechanical system (MEMS) devices, light emitting diodes (LEDs), laser diodes (LDs), power switches (e.g. transistors), and power rectifies. In an embodiment, the methods can be used for fabricating MEMS devices in which the sacrificial layer can be formed by either the first (lightly) doped region/layer or the second (heavily) doped region/layer, depending on the need for the actual device structure. In an embodiment, the methods can be used for fabricating deep-trench etching processing or shallow-recessed doping selective wells in the fabrication of group-III-N power switches, e.g., rectifiers and bipolar transistors.

In some embodiments, wet-etching techniques can be utilized in fabricating optoelectronic devices having alternating air gap layers/regions and semiconductor layers/regions. FIG. 1 shows a schematic representation of a cross section of an example optoelectronic device 100 that includes a DBR 150. As shown, the DBR 150 can include five pairs of alternating air gap layers 110a-e and semiconductor layers 106a-e wherein each layer pair in the five pairs has one air gap layer and one semiconductor layer. The DBR 150 can further include an additional semiconductor layer 106f. The optoelectronic device 100 can further include additional structures, wherein the structures may provide desired mechanical and/or electrical functionality to the optoelectronic device 100. For example, as shown, the optoelectronic device 100 may include a substrate 102, a stack 104, and additional layers and/or surface structures 116. In some embodiments, the substrate 102 can be a crystal structure suitable for growth of a wide bandgap semiconductor material, such as quartz, and the stack 104 can include layers of wide bandgap semiconductor materials such as GaN, n-type AlGaN, and lightly doped AlGaN. In some embodiments, the DBR 150 can be fabricated on the stack 104 by growing alternating layers of a first (lightly) doped semiconductor material and second (heavily) doped semiconductor material, then subsequently applying wet-etching techniques to selectively remove portions of either the first (lightly) doped or second (heavily) doped semiconductor material leaving behind air gap layers 110a-e in etched portions. As illustrated in FIG. 1, portions semiconductor layers 108a-e can be removed, leaving behind air gap layers 110a-e, while semiconductor layers 106a-f remain.

In some embodiments, a semiconductor sample can include a substrate 102, a stack 104, a plurality of semiconductor layers 106a-f that are heavily doped, and a plurality of semiconductor layers 108a-e that are lightly doped. The semiconductor sample can be selectively wet-etched using the EC technique to remove portions of the heavily doped semiconductor layers, leaving behind air gap layers 110a-e.

In some embodiments, a semiconductor sample can include a substrate 102, a stack 104, a plurality of semiconductor layers 106a-f that are lightly doped, and a plurality of semiconductor layers 108a-e that are heavily doped. The semiconductor sample can be selectively wet-etched using the ELPEC technique to remove portions of the lightly doped semiconductor layers, leaving behind air gap layers 110a-e. The optoelectronic device can include additional layers and/or structures 116 fabricated on top of the DBR 150. The layers and/or structures 116 may provide desired electrical and/or mechanical functionality of the optoelectronic device.

Figure 4:
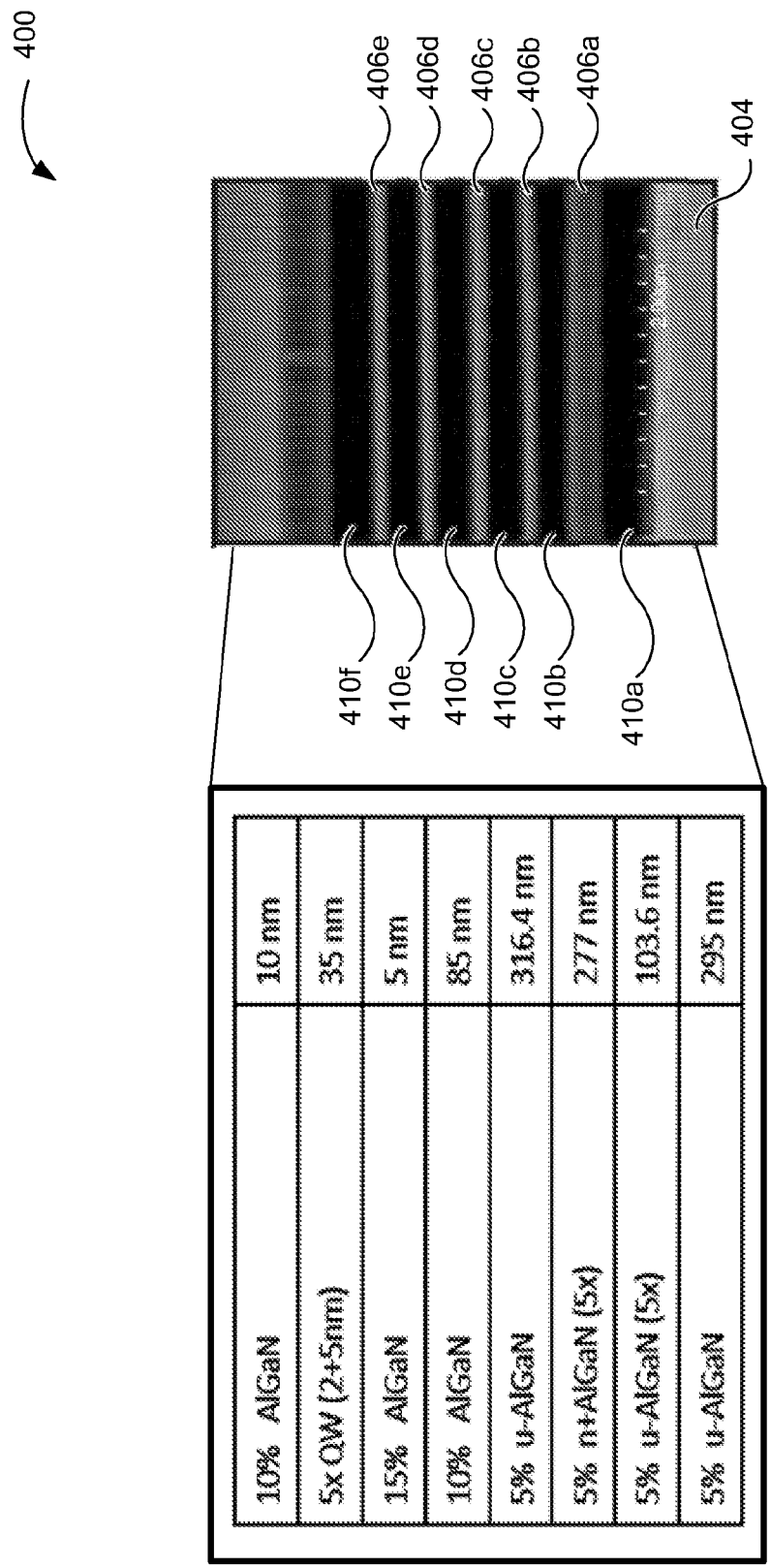
FIG. 4 is a scanning electron microscope (SEM) image of a cross section of a DBR according to an embodiment of the invention.

A potential benefit of certain embodiments of methods described herein is that a DBR fabricated by this method can achieve higher reflectivity for a given range of wavelengths with fewer layer pairs. For example, a reflectivity of 99.3% at a wavelength of 370 nm and a 3 dB bandwith of −46 nm can be achieved with as few as five layer pairs in a DBR fabricated according to certain method embodiments. The disclosed methods minimize thickness in the DBR stacks, which can be a particularly difficult feat for near-ultraviolet −300-370 nm DBRs. The selective wet-etching technique was used to create a distributed Bragg reflector (DBR) using alternating III-N/air gap stacks. FIG. 4, discussed in more detail below, shows cross-sectional SEM pictures that identified five pairs of AlGaN (~100 nm) and air (~270 nm).

As a person of ordinary skill in the art would know, the thickness of a layer in such devices is dependent on the intended optical wavelength ($\lambda_1$) of operation and is equal to one quarter of the optical wavelength ($\lambda_1$) plus a multiple of half wavelength, i.e., thickness=$\lambda_1/4+m(\lambda_1/2)$, where m∈[0, 1, 2, 3 . . . ]. $\lambda_1$ is calculated by the free space wavelength ($\lambda$) divided by the refractive index of the first and the second semiconductor. For the air gap layer thickness, a person of ordinary skill in the art would know that the refractive index of the air is 1.

In some embodiments, the disclosed methods can comprise complementary wet-etching process that can use the ELPEC and EC etching to selectively remove the heavily doped III-N layers from the homojunction, selectively doped regions, or heterostructures and preserve the lightly doped III-N layers, or vice versa, after the etching process.

EXAMPLES

Selective etching techniques were demonstrated using alternating layers of lightly-doped AlGaN and heavily-doped GaN layers grown by metalorganic chemical vapor deposition (MOCVD) techniques. Results demonstrate that EC and ELPEC etching can achieve a selective etching by controlling the doping concentration of a semiconductor layer, which can allow for a flexible, damage-free wet-etching technique for the fabrication of a wide variety of wide bandgap semiconductor devices including III-N devices.

Example 1

Figure 2:
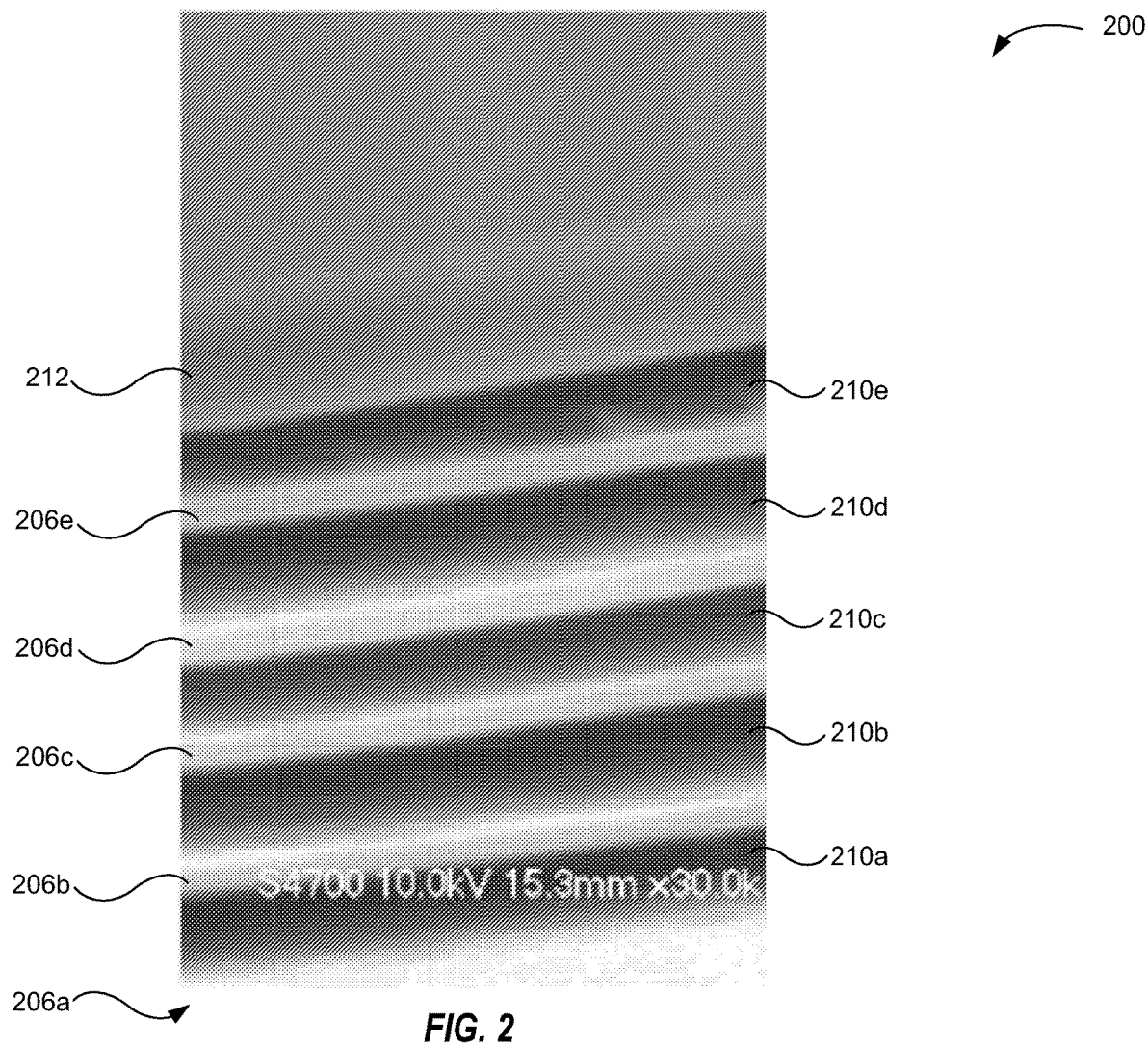
FIG. 2 is a scanning electron microscope (SEM) image of a cross section of an optoelectronic device according to an embodiment of the invention.
Figure 3:
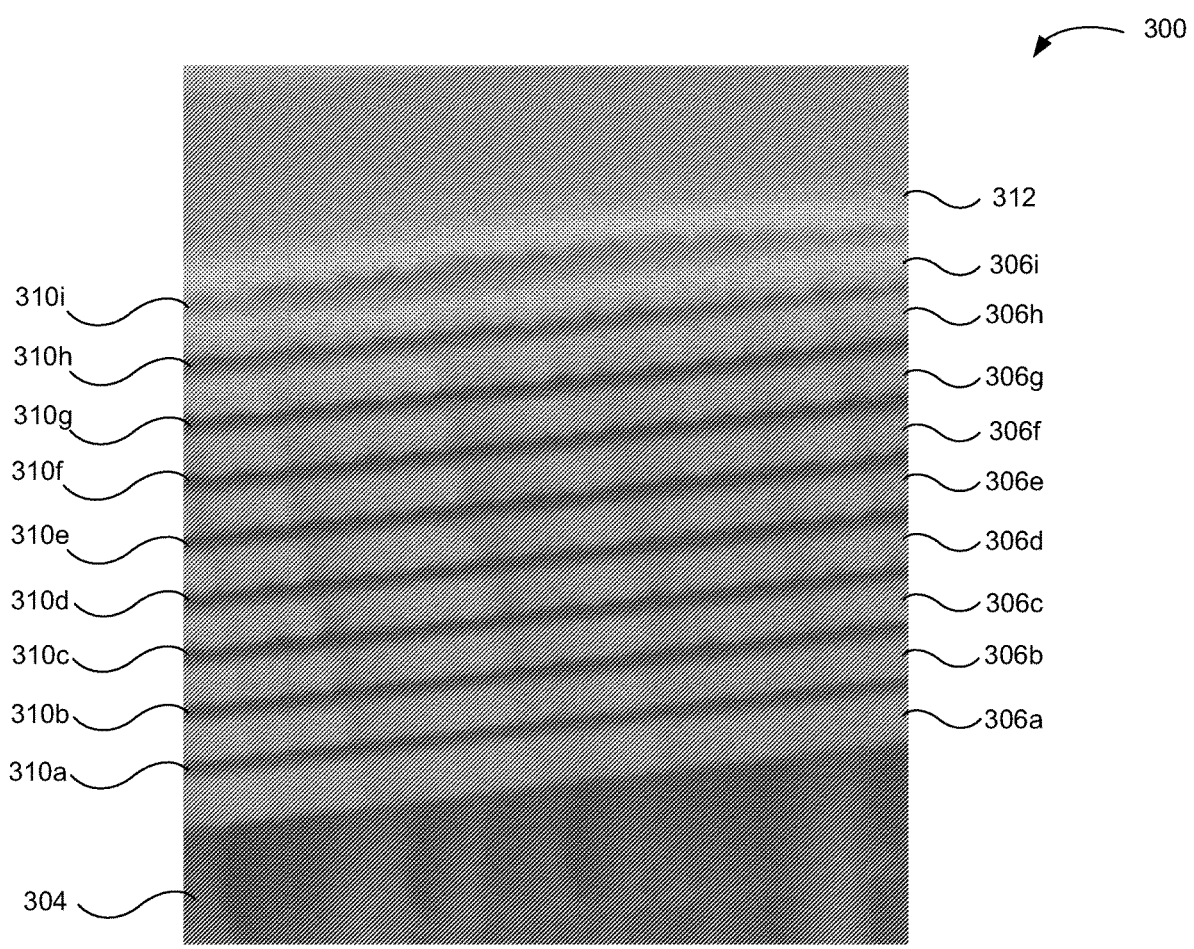
FIG. 3 is a scanning electron microscope (SEM) image of a cross section of an optoelectronic device according to an embodiment of the invention.

FIGS. 2, and 3 show cross sections of two different devices fabricated by utilizing wet-etching techniques according to aspects of certain embodiments. The exemplary devices shown in FIGS. 2 and 3 comprise 10 and 5 air gap/semiconductor layer pairs. Prior to applying a wet-etching technique to the respective semiconductor devices, the semiconductor samples from which the devices were fabricated comprised alternating highly doped and lightly doped layer pairs. During the wet etching, either the highly doped layers or the lightly doped layers were removed by etching. Once the samples were removed from the liquid-phase solution and dried, the removed layers filled with air, creating the air gap layers in the final devices. The free electron concentration difference between the etched and unetched layers was greater than 1,000 for the EC etching and <0.001 for the ELPEC etching, respectively.

FIG. 3 is an SEM image of a cross section of a semiconductor device 300 that includes pairs of alternating air gap layers 310a-i and semiconductor layers 306a-i wherein each layer pair in the pairs has one air gap layer and one semiconductor layer. The example shown in FIG. 3 was fabricated using ELPEC etching techniques, such that the 39.3 nm thick lightly-doped AlGaN semiconductor layers (not shown) were removed, leaving behind air gap layers 310a-i and heavily doped 92 nm thick GaN semiconductor layers 310a-i. The semiconductor sample 300 further includes a top heavily doped semiconductor layer 312. The semiconductor sample 300 further includes buffer 304.

The study showed that ELPEC etching techniques utilizing a liquid-phase solution comprising KOH and $K_2S_2O_8$ at concentrations of 0.0005 moles/L and 0.001 moles/L respectively, with four hours of etching in the solution can restore atomically smooth sidewalls. It effectively removed the ICP-induced damage on the GaN surface layer and helped preserve and reveal the undamaged doped GaN layers. Although it etched lightly doped n-type (Al)GaN effectively, the etching of p-type GaN:Mg or heavily doped n-type ($n>10^{18}$ cm$^{-3}$) (Al)GaN layers using ELPEC was not apparent.

Without wishing to be bound by theory, such characteristics may be related to the mid-gap Fermi level pinning at the liquid-GaN interface: deep-level states in the plasma-damaged GaN surface provide effective Shockley-Read-Hall (SRH) electron-hole pair (EHP) generation sources which enhances the chemical reaction rate on damaged GaN layers. As highly defective GaN regions are removed and "pristine" doped GaN is exposed to the liquid-semiconductor interface, the surface depletion builds up and subsequently reduces the etching rate. This doping-selective etching mechanism supports the observation that decreasing etching rate with increased doping in the ELPEC etching of n-type GaN. With proper concentration mixtures and related parameters, the etch rate and surface morphology can be optimized and a selective doping etching method can be implemented.

Selective wet etching of heavily doped n-type GaN over lightly doped n-type GaN or p-type GaN layers, on the other hand, can be achieved using a form of EC etching. FIG. 2 is an SEM image of a cross section of semiconductor device 200 that includes five pairs of alternating air gap layers 210a-e and semiconductor layers 206a-e wherein each layer pair in the five pairs has one air gap layer and one semiconductor layer. The example shown in FIG. 2 was fabricated using EC etching techniques, such that heavily doped semiconductor layers were removed (not shown), leaving behind air gap layers 210a-e and lightly doped semiconductor layers 206a-e. The optoelectronic device further includes a top semiconductor layer 212.

The EC etching used electrodes, one attached to the semiconductor and the other submerged in the liquid solution, to enable electrochemical etching of GaN in acids (e.g. $H_3PO_4$) at certain temperatures. The EC etching of GaN layers may be controlled by the conductivity of a GaN layer. The conductivity-selective etching property facilitated the high etching rate of heavily-doped GaN layers over lightly-doped ones. FIG. 2 shows a demonstration of using the EC etching to selectively etch a five-pair 277-nm-thick heavily doped n-type GaN and 112-nm-thick undoped $Al_{0.05}Ga_{0.95}N$ microstructure using the EC etching with a room-temperature (300K) 85% wt. $H_3PO_4$ at 15V for 0.5 hour. The heavily doped n-type GaN layers are selectively etched creating an air gap between the undoped AlGaN layers. The undoped GaN buffer layer 206a at the bottom of the picture serves as an etch-stop layer to prevent further etching in the c-axis direction.

This example clearly demonstrated the feasibility of combining the EC and ELPEC etching to achieve a selective etching by controlling the doping concentration of a semiconductor layer, which allows for a flexible damage-free GaN wet-etching technique for the fabrication of a wide variety of III-N (and other) devices.

Example 2

FIG. 4 shows an SEM image of alternating semiconductor layers 406a-e and air gap layers 410a-f on an UID buffer layer 404 in a DBR device 400 fabricated from a complementary conductivity-selective wet-etch method that etches either heavily or lightly doped AlGaN n-type layers with alternating binary doped profiles. The fabricated DBR 400 demonstrates the ability to achieve a versatile air-gap/semiconductor DBR devices using complementary conductivity-selective wet-etching techniques. The example DBR 400 structure shown in FIG. 4 was selectively wet-etched using, $H_3PO_4$-based electrochemical (EC) etch to selectively etch heavily doped n-type AlGaN (n>1×10$^{18}$ cm$^{-3}$) over lightly-doped f AlGaN. Prior to etching, the depicted DBR layers comprised approximately 277 nm thick heavily doped n+ AlGaN layers alternating between approximately 103.6 nm thick lightly-doped AlGaN layers. During wet-etching the n+ AlGaN layers were removed, leaving behind air gap layers 410a-f having a thickness of approximately 283 nm and light-doped AlGaN layers having a thickness of approximately 103 nm.

What is claimed is:

1. A method comprising:
    wet-etching a first doped region of a semiconductor sample with a liquid-phase solution at a first etch rate; and
    wet-etching a second doped region of the semiconductor sample with the liquid-phase solution at a second etch rate;
    wherein a free electron concentration of the first doped region is different than a free electron concentration of the second doped region;
    wherein the first and the second doped regions are each n-type doped regions;
    wherein the first doped region and the second doped region each comprise a wide bandgap semiconductor material selected from the group consisting of a Group-III-Nitride and zinc oxide; and
    wherein one of the first etch rate and second etch rate is from about 10 times to about 300 times greater than the other of the first etch rate and the second etch rate.

2. The method of claim 1, wherein one of the first doped region and second doped region has a free electron concentration of from about $10^{-15}$ cm$^{-3}$ to about $5\times10^{16}$ cm$^{-3}$; and
    wherein the other of the first doped region and the second doped region has a free electron concentration of from about $1\times10^{18}$ cm$^{-3}$ to about $10^{21}$ cm$^{-3}$.

3. The method of claim 1, wherein one or both of the first etch rate and the second etch rate are from about 0.1 nm per minute to 1000 nm per minute.

4. The method of claim 1, wherein the wet-etching of the first doped region and the second doped region are performed at a temperature of from about 20° C. to about 100° C.

5. The method of claim 1, wherein the first doped region and the second doped region each comprise a wide bandgap semiconductor material selected from the group consisting of a binary compound, ternary compound, and quaternary compound.

6. The method of claim 1, wherein the first doped region is a first layer of the semiconductor sample;
    wherein the second doped region is a second layer of the semiconductor sample; and
    wherein each of the first and second layer of the semiconductor sample has a thickness of between about 50 nm and about 5000 nm.

7. The method of claim 1 further comprising:
    applying a UV light source to the semiconductor sample; and
    removing the semiconductor sample from the liquid-phase solution.

8. The method of claim 7, wherein an emission wavelength range of the UV light source is from about 900 nm to about 190 nm.

9. The method of claim 1, wherein the liquid-phase solution comprises a hydroxide and a persulfate.

10. The method of claim 1, wherein the liquid-phase solution is an aqueous solution comprising:
    potassium hydroxide (KOH) at a concentration of from about 0.001 to about 10 mole/L; and
    potassium persulfate ($K_2S_2O_8$) at a concentration of from about 0.001 to about 10 mole/L.

11. The method of claim 1 further comprising:
    attaching a first end of an anode to a noble metal and a second end of the anode to a source;
    attaching a first end of a cathode to the semiconductor sample and a second end of the cathode to the source; and providing electrical energy by the source in a form selected from the group consisting of direct current, alternating current, and pulsed width current, in which a width of a pulse is at least 10 ns.

12. The method of claim 1, wherein the liquid-phase solution consists of an acid.

13. The method of claim 12, wherein the liquid-phase solution is selected from the group consisting of phosphoric acid, nitric acid, and hydrochloric acid.

14. The method of claim 1, wherein the free electron concentration of the first doped region is less than the free electron concentration of the second doped region; and
wherein wet-etching the semiconductor sample forms an etched region and an unetched region.

15. The method of claim 14, wherein the etched region comprises an air gap region.

16. The method of claim 1, wherein the method is a method of fabricating a distributed Bragg reflector (DBR) that has a reflectivity of from about 30% to about 99.9% at a center wavelength range of from about 100 nm to about 900 nm.

17. The method of claim 16 further comprising disposing an air gap region having a thickness of about 40 nm to about 1000 nm between the first doped region and the second doped region.

18. A method for selectively wet-etching a semiconductor sample comprising:
wet-etching at a temperature of from about 20° C. to about 100° C. a first n-type doped region of a semiconductor sample in a liquid-phase solution by applying a UV light source to the semiconductor sample, wherein the wet-etching of the first n-type doped region is at a first etch rate, wherein the first n-type doped region has a free electron concentration of from about $1\times10^{15}$ cm$^{-3}$ to about $5\times10^{16}$ cm$^{-3}$, and wherein the first n-type doped region has a thickness between about 50 nm and about 5000 nm;
wet-etching at a temperature of from about 20° C. to about 100° C. a second n-type doped region of the semiconductor sample with the liquid-phase solution at a second etch rate, wherein the second n-type doped region has a free electron concentration of from about $1\times10^{18}$ cm$^{-3}$ to about $10^{21}$ cm$^{-3}$, and wherein the second n-type doped region has a thickness between about 50 nm and about 5000 nm; and
removing the semiconductor sample from the liquid-phase solution;
wherein one or both of the first etch rate and the second etch rate are from about 0.1 nm per minute to 1000 nm per minute; and
wherein one of the first etch rate and second etch rate is from about 10 times to about 300 times greater than the other of the first etch rate and the second etch rate.

19. The method of claim 18, wherein the liquid-phase solution comprises a hydroxide and a persulfate.

20. The method of claim 18, wherein the liquid-phase solution is an aqueous solution comprising:
potassium hydroxide (KOH) at a concentration of from about 0.001 to about 10 mole/L; and
potassium persulfate ($K_2S_2O_8$) at a concentration of from about 0.001 to about 10 mole/L.

21. The method of claim 18 further comprising:
attaching a first end of an anode to a noble metal and a second end of the anode to a source;
attaching a first end of a cathode to the semiconductor sample and a second end of the cathode to the source; and
providing electrical energy by the source in a form selected from the group consisting of direct current, alternating current, and pulsed width current, in which a width of a pulse is at least 10 ns.

22. The method of claim 18, wherein the liquid-phase solution consists of an acid.

23. The method of claim 18, wherein the liquid-phase solution is selected from the group consisting of phosphoric acid, nitric acid, and hydrochloric acid.

* * * * *